United States Patent [19]
Wright

[11] Patent Number: 5,629,836
[45] Date of Patent: May 13, 1997

[54] LEVER MECHANISM

[75] Inventor: Andrew C. W. Wright, Surrey, United Kingdom

[73] Assignee: DZUS Fastener Europe Ltd., Surrey, United Kingdom

[21] Appl. No.: 519,607

[22] Filed: Aug. 25, 1995

[30] Foreign Application Priority Data

Aug. 25, 1994 [GB] United Kingdom ............... 9417194

[51] Int. Cl.$^6$ ........................................ H05K 5/00
[52] U.S. Cl. ..................... 361/755; 361/754; 361/798; 439/157
[58] Field of Search ............... 292/256; 361/754, 361/755, 759, 798, 801; 439/157, 153, 152, 160

[56] References Cited

U.S. PATENT DOCUMENTS

| | | | |
|---|---|---|---|
| 2,869,909 | 1/1959 | Harling | 292/256 |
| 2,872,234 | 2/1959 | Brinton | 292/256 |
| 4,699,594 | 10/1987 | Assel et al. | 439/152 |
| 5,293,303 | 3/1994 | Fletcher et al. | 361/798 |
| 5,373,419 | 12/1994 | Wright | 361/754 X |
| 5,504,656 | 4/1996 | Joist | 361/754 |

FOREIGN PATENT DOCUMENTS 1-269762  10/1989  Japan ................... 292/256

*Primary Examiner*—Rodney M. Lindsey
*Attorney, Agent, or Firm*—Hoffmann & Baron

[57] ABSTRACT

A lever mechanism (1) for clamping a panel (3) to a housing has a support block (2) which, in use, is attached to a panel (3). A first lever (4) is pivotally connected to the support block (2), and arranged so that, in use, it can engage with the housing when in a first position and disengage from the housing when in a second position. A second lever (9) is pivotally mounted on the first lever, and arranged to hold the first lever in its first position by engagement with the support block. A spring or springs (8) biases the first lever towards the second position and/or biases the second lever towards the position in which it engages with the support block. The first lever (4) is mounted for translational movement relative to the support block (2) against the action of a further spring (15) to provide, in use, a predetermined clamp load between the panel (3) and housing.

19 Claims, 4 Drawing Sheets

LOCKED POSITION

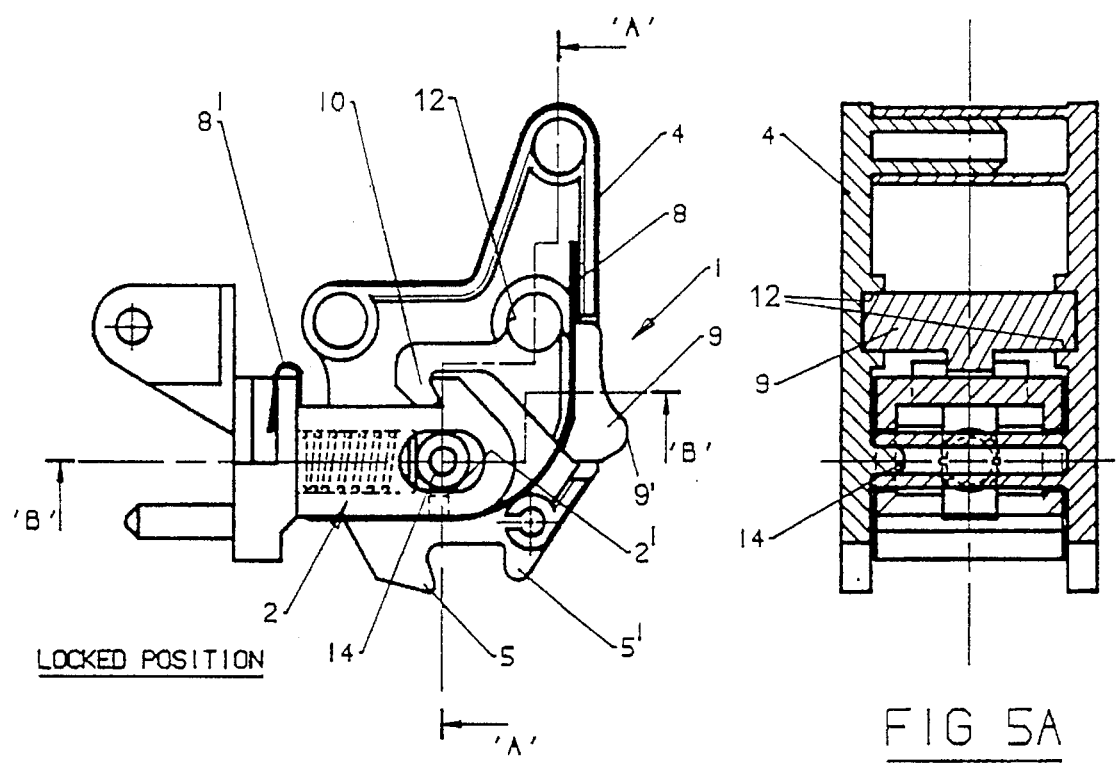
LOCKED POSITION
FIG 1
FIG 5A
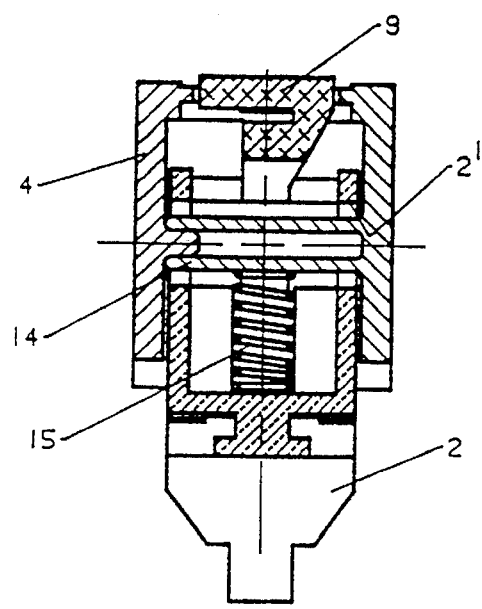
FIG 5B

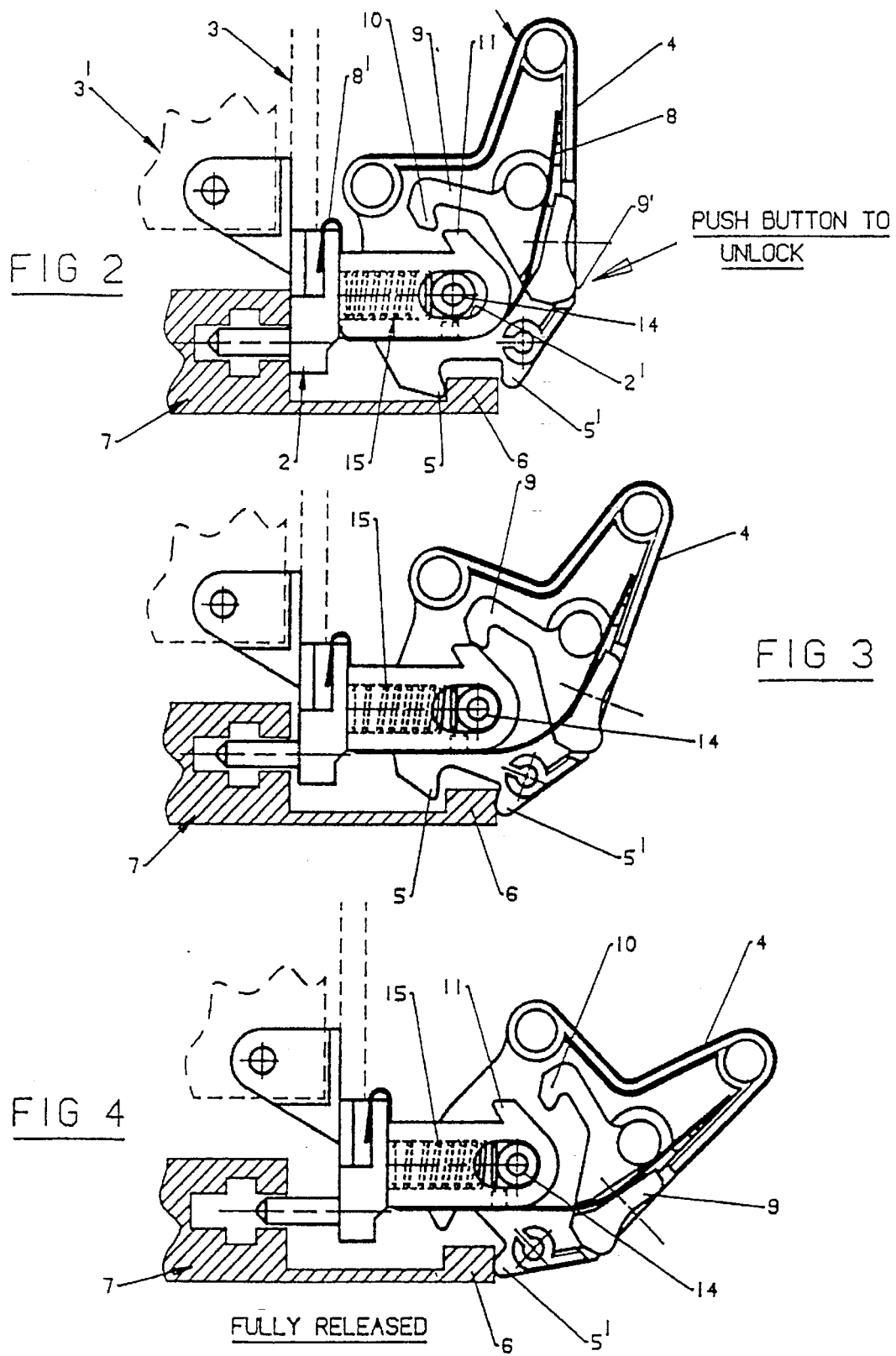

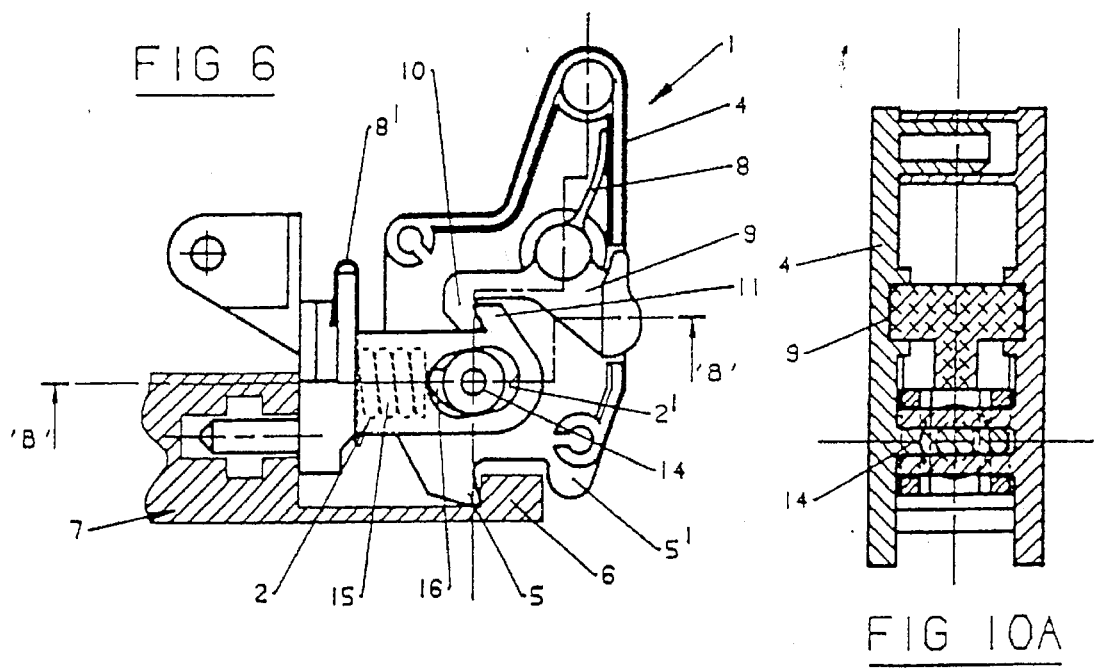
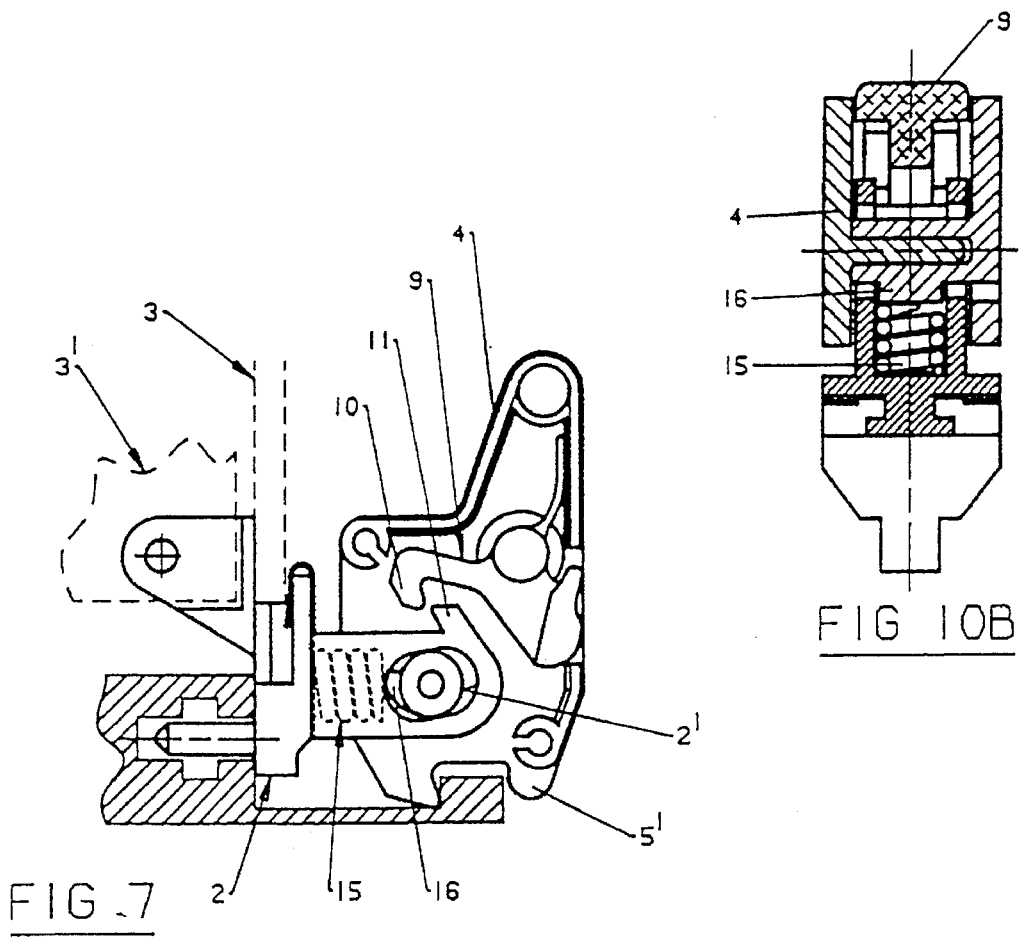

FULLY RELEASED

LEVER MECHANISM

This invention relates to lever mechanisms and, more specifically a lever mechanism for clamping printed electronic circuit board panels into multi-pin sockets.

Electronic device manufacturers often, for the purposes of flexibility of design and ease of manufacture, produce devices comprising several separate circuit board panels that are connected to each other and to the housing of the device via large multi-pin plug systems at their rear end. Connecting these panels to the main device housing and into the plugs can require considerable force, especially if a reliable contact is to be assured. Levers for circuit board panels are commonly used by manufacturers, but do not retain the panels firmly in position, and can be jolted open, allowing the boards to work loose.

For example, DE-U-7724549 discloses a lever-type latch for a circuit board that, on closing, urges a panel into contact with a connector, but is only latched in position by being retained on a pin attached to the panel.

U.S. Pat. No. 4,157,583, employs a cam mechanism to urge a circuit board panel into connection, and a shaft acting as a beam spring to provide a biasing force. Again, this device does not provide any secure latching mechanism.

DE-A-3732892, discloses a latching mechanism that is secured with a screw-type mechanism.

GB-A-22310726 discloses a circuit board panel latching mechanism with a retaining hook.

The object of the present invention is to provide a lever mechanism for clamping and retaining a circuit board panel in its housing.

EP-A-0 587 451 discloses a lever mechanism for clamping a panel to a housing, the mechanism comprising a support block which, in use, is attached to a board or panel; a first lever, pivotally connected to the support block, and arranged so that, in use, it can engage with the housing when in a first position and disengages from the housing when in a second position; a second lever, pivotally mounted on the first lever, and arranged to hold the first lever in its first position by engagement with the support block; and a spring, for biasing the first lever towards the second position and also for biasing the second lever toward the position in which it engages with the support block.

However, in some cases, it is additionally desirable to maintain a substantially constant and predetermined clamp load between the housing and the board/panel and tolerances in the thickness of the panel and the arrangement of the fixing points on the housing makes this difficult to achieve in such a device.

According to the present invention therefore, there is provided a lever mechanism for clamping a panel to a housing, the mechanism comprising:

a support block which, in use, is attached to a panel;

a first lever, pivotally connected to the support block, and arranged so that, in use, it can engage with the housing when in a first position and disengage from the housing when in a second position;

a second lever, pivotally mounted on the first lever, and arranged to hold the first lever in its first position by engagement with the support block; and;

a spring or springs for biasing the first lever towards the second position and/or biasing the second lever towards the position in which it engages with the support block;

characterised in that the first lever is mounted for translational movement relative to the support block against the action of a further spring to provide, in use, a predetermined clamp load between the panel and housing.

Preferably, the pivotal connection of the first lever to the support block comprises a pivot pin on the lever and an elongate slot or slots in which the pivot pin is free both to rotate and move longitudinally along the slot or slots. The further spring can then be a coil spring bearing directly or indirectly on the pivot pin.

Preferably, the further spring bears indirectly on the pivot pin through a bearing washer. Alternatively, or additionally, the pivot pin may be provided with a cam surface against which the spring acts, the cam surface being disposed and arranged to bias the first lever towards the second position. A first spring then preferably acts solely between the first and second levers to bias the second lever towards the position in which it engages with the support block.

As in EP-A-0 587 451, the support block may arranged to hold a stud fastener that provides an additional latch for the panel to the housing or frame in cases where the added security of tool operation is required. The first spring may also be arranged to include a sprag or clip which is used to retain the support block on the panel, and may be made of electrically conductive material and shaped so that it provides an electrical connection between the board and the housing.

Preferably, the first lever comprises two interconnecting longitudinal halves, each half having lugs and/or recesses on their inner surfaces to provide pivotable mountings in the form of a pivot pin for mounting the first lever on the support block, and for the second lever on the first lever.

The lever mechanism of the present invention provides a clamping device that is easily engaged and disengaged, and that is also easily manufactured from a minimum number of components and which enables a predetermined clamp load to be provided regardless of tolerances in components of the panel and housing.

Two examples of the present invention will now be described with reference to the accompanying drawings, in which:

FIG. 1 shows the first lever mechanism in its clamping position;

FIG. 2 shows the first lever mechanism in a partially unclamped position;

FIG. 3 shows the first lever mechanism in a more partially unclamped position;

FIG. 4 shows the first lever mechanism in its completely unclamped position;

FIGS. 5A and 5B are sections on A—A and B—B in FIG. 1;

FIG. 6 shows the second lever mechanism in its clamping position;

FIG. 7 shows the second lever mechanism in a partially unclamped position;

FIGS. 10A and 10B are sections on A—A and B—B in FIG. 6.

Figure 8:
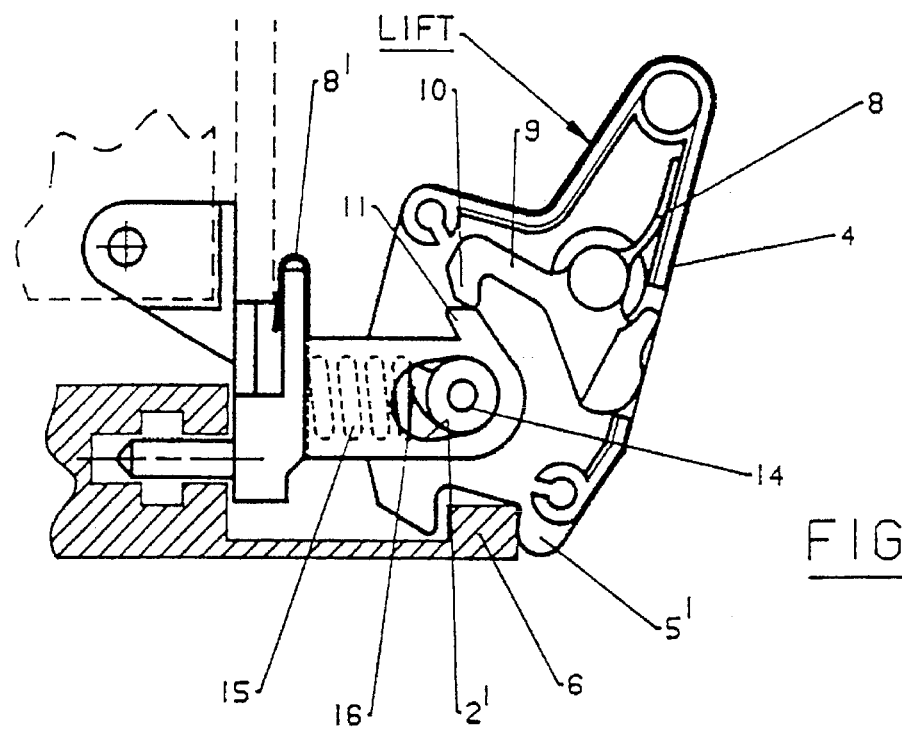
FIG. 8 shows the second lever mechanism in a more partially unclamped position.

Referring to FIGS. 1 to 5, a first lever assembly 1 is shown attached, via a support block 2, to a panel 3 which carries a printed circuit board 3'. The support block 2 is held on the panel 3 by a spring 8 as described below, but could be additionally secured to the panel 3 by screws, a snap-fit assembly, or the like if desired. Pivotally mounted in elongate slots 2' on the support block 2 is a first lever 4. The lever 4 comprises two sections (see FIGS. 5A & 5B) which fit around the support block 2 and a second lever 9 and which also provide a pivot pin 14 against which is engaged a further, coil, spring 15 which biases the first lever away from the panel and provides a clamping force between the panel and housing in use, via the lever 4. The lever 4 has, on one edge, a lug 5 which, when in a locked position, engages with a lip 6 protruding from the inner edge of a housing 7 to clamp the panel in position as shown. On the same edge an opposing lug 5' is formed which engages with the opposite side of the lip 6 during unlatching, to ensure removal of the panel from the housing. Connected to the support block 2 is the spring 8 which sits within the lever 4 and urges it into an unclamped position (shown in FIG. 3), in which the lug 5 is disengaged from the lip 6. As can be seen from the figures, the spring 8 has a clip 8' which engages the surface of the panel 3 to resist removal of the block 2 from the panel 3.

The second lever 9 is pivotally mounted in recesses on the first lever 4. One end of the lever 9 is formed into a surface 9' so that it can be easily depressed. When this end of the lever 9 is depressed, the opposite end of the lever 9 pivots. This end of the second lever 9 is shaped to provide a hook 10 so as to be engageable with a lip 11 positioned on the support block 2 as shown in FIG. 1. In FIGS. 2 to 4 it is shown in a position disengaged from the lip 11. When the lever 4 is rotated into its clamping position, the spring 8 exerts a force on the second lever 9, which pivots to engage the hook 10 with the lip 11 thus holding the whole mechanism in a clamping position due to the pivotal mounting of the second lever 9 on the first lever 4. To release the lever mechanism 1, the second lever 9 is depressed, this causes it to rotate and the hook 10 of second lever 9 disengages from the lip 11 (as shown in FIG. 2) so that the spring 8 then urges the lever 4 into the unclamped position.

When a panel is to be connected to the housing and to an electrical socket, the panel is placed gently in position and pressure applied to the lever 4, engaging the lug 5 against the lip 6 and thus applying an insertion force to the panel against the bias of the spring 15 which continues to maintain a clamping force between the support 2 and the lever 4 and thus, via the support 2, the lever 4 and the lip 6, between the panel and the housing. When the second lever 9 passes over the lip 11, the spring 8 forces the lever 9 into engagement with the lip 11 and the lever is locked.

To release the mechanism, the lever 9 is depressed, disengaging the lever 9 from the lip 11, and allowing the force of the spring 8 to move the lever 4 outward to the unclamped position. The engagement of the lug 5' against the opposite side of the lip 6 ensures detachment so that the panel can then be removed.

Figure 9:
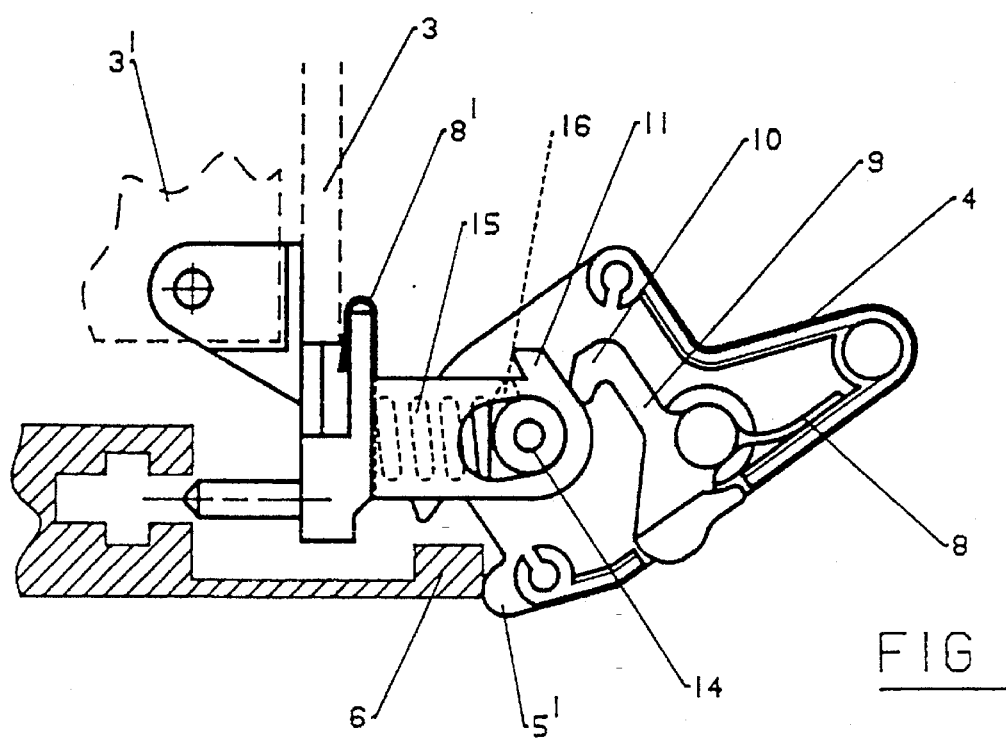
FIG. 9 shows the second lever mechanism in its completely unclamped position.

The second example shown in FIGS. 6 to 10 is substantially similar and the same reference numerals have been used therefore. The significant differences are (a) that the spring 8 is an integral part of the second lever 9 and bears only against the underside of the first lever 4, (b) that a separate spring clip 8' is used to secure the support 2 to the panel 3, and (c) that a cam surface 16 is formed on one side of the pivot pin 14 so as to be engaged by the spring 15. Thus, the functions of the springs 8 & 15 and the spring clip 8' are separated and the spring 15 additionally serves to bias the lever 4 to the unlatched position, the spring 8 serving only to bias the second lever 9 relative to the first lever and the clip 8' serving to retain the support 2 on the panel. It will be seen from FIGS. 6 to 9, the axis of the slots 2' is inclined to the longitudinal axis of the spring 15 and to the general direction of the support 2 and this helps to ensure engagement of the lugs 5 on the lip 6 as the lever pivots and compresses the spring.

If desired, but not shown in the drawings, a lock mechanism may be provided between the second and first levers in order to lock the second lever in the latched position. A spring loaded locking peg may be provided on the first or second levers and may be freed to move or locked in the engaged position by a suitable key-operated lock, thus allowing the latch to be set with a key for either normal push button operation, i.e. pushing on the second lever to release the first lever, or in a mode in which the latch may be slammed shut but require operation of the lock to release it before pushing on the secondary lever allows the latch to be opened.

I claim:

1. A lever mechanism for clamping a panel to a housing, said lever mechanism comprising:

a support block adapted to be attached to said panel;

a first lever, pivotally connected to said support block, and arranged so that it can engage with said housing when in a first position and disengage from said housing when in a second position;

a second lever, pivotally mounted on said first lever, and arranged to hold said first lever in its said first position by engagement with said support block; and;

at least one first spring for biasing said first lever towards said second position and biasing said second lever towards the position in which it engages with said support block; and a second spring; wherein said first lever is mounted for translational movement relative to said support block against an action of said second spring to provide a predetermined clamp load between the panel and housing.

2. A lever mechanism according to claim 1, wherein the pivotal connection of said first lever to said support block comprises a pivot pin on said first lever and at least one elongate slot in which the pivot pin is free both to rotate and move longitudinally along said slot or slots.

3. A lever mechanism according to claim 2, wherein said second spring is a coil spring bearing directly or indirectly on the pivot pin.

4. A lever mechanism according to claim 2, including a bearing washer, and wherein said second spring bears indirectly on said pivot pin through said bearing washer.

5. A lever mechanism according to claim 4, wherein said pivot pin is provided with a cam surface against which said at least one first spring acts, the cam surface being disposed and arranged to bias the first lever towards the second position.

6. A lever mechanism according to claim 5 in which said at least one first spring acts between said first and second levers to bias said second lever towards said position in which it engages with said support block.

7. A lever mechanism according to claim 1, wherein said first lever comprises two interconnecting longitudinal halves, each half having lugs and/or recesses on their inner surfaces to provide pivotable mountings in the form of a pivot pin for mounting said first lever on said support block, and for said second lever on said first lever.

8. A lever mechanism according to claim 1, wherein said first spring is arranged to include a sprag or clip which is used to retain said support block on said panel.

9. A lever mechanism according to claim 1, wherein said at least one spring is made of electrically conductive material and shaped so that it provides an electrical connection between said panel and said housing.

10. A lever mechanism for clamping a panel to a housing, said lever mechanism comprising:

a support block adapted to be attached to said panel;

a first lever, pivotally connected to said support block, and arranged so that it can engage with said housing when in a first position and disengage from said housing when in a second position;

a second lever, pivotally mounted on said first lever, and arranged to hold said first lever in its said first position by engagement with said support block; and;

at least one first spring for biasing said second lever towards the position in which it engages with said support block; and a second spring; wherein said first lever is mounted for translational movement relative to said support block against an action of said second spring to provide a predetermined clamp load between the panel and housing.

11. A lever mechanism according to claim 10, wherein said first lever comprises two interconnecting longitudinal halves, each half having lugs and/or recesses on their inner surfaces to provide pivotable mountings in the form of a pivot pin for mounting said first lever on said support block, and for said second lever on said first lever.

12. A lever mechanism according to claim 10, wherein the pivotal connection of said first lever to said support block comprises a pivot pin on said first lever and at least one elongate slot in which the pivot pin is free both to rotate and move longitudinally along said slot or slots.

13. A lever mechanism according to claim 12, wherein said second spring is a coil spring bearing directly or indirectly on the pivot pin.

14. A lever mechanism according to claim 12, including a bearing washer, and wherein said second spring bears indirectly on said pivot pin through said bearing washer.

15. A lever mechanism according to claim 14, wherein said pivot pin is provided with a cam surface against which said at least one first spring acts, the cam surface being disposed and arranged to bias the first lever towards the second position.

16. A lever mechanism according to claim 15 in which said at least one first spring acts between said first and second levers to bias said second lever towards said position in which it engages with said support block.

17. A lever mechanism according to claim 10, including a stud fastener to provide an additional latch for said panel to said housing, and in which said support block is arranged to hold said stud fastener.

18. A lever mechanism according to claim 10, wherein said first spring is arranged to include a sprag or clip which is used to retain said support block on said panel.

19. A lever mechanism according to claim 10, wherein said at least one spring is made of electrically conductive material and shaped so that it provides an electrical connection between said panel and said housing.

* * * * *